United States Patent [19]
Alfaro et al.

[11] Patent Number: 5,435,876
[45] Date of Patent: Jul. 25, 1995

[54] GRID ARRAY MASKING TAPE PROCESS

[75] Inventors: Rafael C. Alfaro, Carrollton; David Blair, Allen, both of Tex.

[73] Assignee: Texas Instruments Incorporated, Dallas, Tex.

[21] Appl. No.: 38,779

[22] Filed: Mar. 29, 1993

[51] Int. Cl.$^6$ .............................................. B32B 31/00
[52] U.S. Cl. ..................... 156/247; 156/250; 156/257; 156/289; 428/343; 428/352
[58] Field of Search ............... 156/247, 248, 275.5, 156/344, 250, 257, 289; 428/343, 345, 352

[56] References Cited

U.S. PATENT DOCUMENTS

| | | | |
|---|---|---|---|
| 4,338,149 | 7/1982 | Quaschner | 156/250 X |
| 4,793,883 | 12/1988 | Sheyon et al. | 156/247 X |
| 4,897,141 | 1/1990 | Girard | 156/344 X |
| 4,925,515 | 5/1990 | Yoshimura et al. | 156/250 |
| 4,961,804 | 10/1990 | Aurichio | 156/344 X |
| 5,006,202 | 4/1991 | Hawkins et al. | 156/644 |
| 5,098,501 | 3/1992 | Nishiguchi | 156/275.5 |
| 5,110,388 | 5/1992 | Komiyama et al. | 156/275.5 X |
| 5,187,007 | 2/1993 | Ebe et al. | 428/345 X |

*Primary Examiner*—David A. Simmons
*Assistant Examiner*—Paul M. Rivard
*Attorney, Agent, or Firm*—Robert C. Klinger; James C. Kesterson; Richard L. Donaldson

[57] ABSTRACT

Active sites (18) on a semiconductor wafer (14) are protected from particulate and fluid contaminants (40,42) while the wafer (14) is sawed into chips (16) by a tape (62) carrying a pattern of adhesive (64) which is congruent and registerable with saw paths (15) between the active sites (18). Adhering the tape (62) to the wafer (14) encapsulates each active site (18) beneath a non-adherent protective envelope which if formed by adhesive-free portions (68) of the tape (62) as sawing occurs along the saw paths (15) and the congruent adhesive pattern (64). After sawing, the adhesive (64) is treated, as by directing UV through the tape (62), to release the tape (62) from the chips (16).

25 Claims, 5 Drawing Sheets

GRID ARRAY MASKING TAPE PROCESS

BACKGROUND OF THE INVENTION

The present invention relates to the protection of active sites on a semiconductive wafer which is sawed into individual active-site-bearing chips, and, more particularly, to a method of and apparatus for protecting, during and after sawing, such active sites in a plurality of arrays or matrices from debris and deleterious substances which are produced by, or are used in, such sawing.

Numerous processes are known for producing plural arrays of active sites in and on a first surface of a semiconductor wafer. Each active site may comprise one or more transistors and may include an integrated circuit having other circuit components. The wafer is ultimately separated into a plurality of individual chips, also known as dies or bars, each of which includes one of the active site arrays, the array having a "top" surface comprising a portion of what was formerly the wafer's first surface. Each active site array has associated therewith one or more bond pads on its top surface. The bond pads are rendered selectively electrically continuous with the active sites, typically by depositing or otherwise forming them on top of, and in electrical contact with, conductors formed on the wafer. Some of the same steps used to produce the active sites may also produce the conductors, which are themselves electrically continuous with the active sites.

The separation of the wafer into individual chips is effected by an operation which may be referred to as "sawing." Sawing separates the wafer along lines or paths extending between locations whereat adjacent active site arrays reside or will ultimately reside.

Sawing, which typically involves mechanical abrasion and erosion of the wafer, may be achieved by a number of techniques, including those which utilize rotating saw blades and vibrating tips. Accordingly, the act of sawing the wafer itself produces substantial debris which includes small pieces of the wafer and possibly small pieces of the saw blade or vibrating tip. Sawing is also typically accompanied by cooling/lubricating fluids and other substances which prevent the saw blade or tip from damaging the wafer and which prolong the life of the saw blade or tip.

The debris resulting from and the substances used in sawing can degrade the performance of or render inoperative the active sites. As a consequence, wafers are often sawed into chips before carrying out the processing which produces the active sites. The resulting chips are maintained in a chip matrix after sawing, and the chip matrix is processed to produce the active site arrays on each one thereof.

If the active sites include a spatial light modulator ("SLM"), such as that known as a deflectable mirror device or a digital micromirror device (collectively "DMD"), each active site may be even more sensitive to the effects of the debris and fluids resulting from and used in sawing.

A DMD is a multilayered structure formed on a wafer, which includes a light-reflective beam or similar mechanical member. The member is associated with an active site and is so mounted to, or hinged from, the material of the wafer as to be deflectable or movable between a normal position and other positions. Deflection of the beam may be achieved by electrostatically attracting the beam toward (or to) an adjacent electrode which is at a different electrical potential from that of the beam. Deflection of the beam stores energy in its mount or hinge, which stored energy tends to return the beam to its normal position. Movement of the beam, which may be binary or analog, is controlled by the circuit components of the active site associated with the beam and functioning as an addressing circuit. Deflection of the beam is facilitated by an undercut well which underlies the beam. The well is formed by appropriate etching of one of the layers of material deposited on the wafer.

In use, an array or matrix of DMD's is arranged to receive light from a source. The received light which is incident on the reflective beams is selectively reflected or not reflected onto a viewing surface depending on the position of the beams. Such reflected light is directed by each beam onto the viewing surface in only one selected position, which may be the normal position or one of the other positions. In all other positions of each beam other than the selected position, the incident, reflected light is directed in such a way that it does not fall on the viewing surface. Appropriate energization of the circuit components of the addressing circuit associated with each beam of each active site in the array or matrix permits the beam-reflected light on the viewing surface to be presented as a rasterized array of pixels (as in a typical television) or as a scanning line of pixels (as in a line printer). Thus, the beam of each active site is or acts as a pixel.

Because a DMD includes circuit components as well as a microminiature deflectable beam, it is especially sensitive to debris resulting from sawing the wafer and to the fluids and other substances used to facilitate sawing. Such debris can enter the undercut well and prevent deflection of the beam. Thus, in one extant technique, formation of the circuit components of the active sites and etching or other steps which define the beams are followed by the deposit of a protective layer thereon. Sawing of the wafer to separate the arrays then proceeds, the protective layer preventing the sawing operation from damaging the circuit components and the etch-defined beams. After sawing is completed, the protective layer is removed and the undercut wells are then formed under each beam. Formation of the wells at this time obviates the sawing-related and substances from entering the wells.

Sawing of wafers before active site formation requires either that the resulting chips be accurately maintained in their original relative orientation during active site producing processing or that each chip be individually processed to produce its array of active sites. These expedients are costly and their implementation is time-consuming. The above-noted sequence, in which circuit component formation and beam-defining etching occur before sawing, nonetheless requires the emplacement of the protective layer, which is removed following sawing. The deposit of and subsequent removal of the protective layer, which serves only the purpose of protecting the circuit components and the etch-defined beam during sawing, is, again, costly and time-consuming.

One object of the present invention is the provision of a method of, and apparatus for, protecting each active site in plural active site arrays on a fully processed semiconductor wafer, particularly active sites which include a DMD SLM or other micromachine, which DMD, in turn, includes both circuit components and a deflectable, light-reflecting beam, so that circuit component formation, beam-defining etching and well formation may all be carried out on an unsawed wafer to thereby minimize processing steps while protecting the active sites from sawing-caused damage.

SUMMARY OF THE INVENTION

With the above and other objects in view, in its broadest aspect the present invention contemplates a method of protecting the active sites on a first surface of a fully processed semiconductor wafer from contaminants produced by and utilized in sawing the wafer into individual chips, each chip having an active site thereon. Sawing proceeds along saw paths extending between the active sites. First, the first surface of the wafer is contracted with a first tape-like member. The first member has on one side thereof an adhesive pattern which is congruent and registerable with the saw paths. These saw paths or "streets" may be defined by scribing the wafer.

The adhesive pattern adheres to the first surface of the wafer along the saw paths so that the non-adhesive-containing portions of the member bounded by the adhesive pattern overlie and encapsulate the sites to seal them against the entry of the contaminants.

Next, the wafer is sawed into chips along the paths. This sawing also saws or cuts the member into segments each adhered to one chip. Last, the adhesive is treated to release the segments from the chips.

In preferred embodiments the treatment of the adhesive to release the segments from the chips occurs through the segments. Specifically, it is preferred that the member be UV-transmissive and that the adhesive become non-adherent when exposed to UV. For example, the adhesive may be one which polymerizes and hardens when exposed to UV thereby losing its adherency. Once the adhesive on the segments is not longer adherent, the segments and the chips separate or may be separated by using expedients such as negative-pressure applying tools.

For the purpose of holding the wafer in a saw frame or for facilitating alignment of the adhesive pattern with the sawing paths, a second tape-like member having one surface entirely coated with a UV-degradable adhesive may be adhered to a second surface of the wafer opposite the first surface. This second member may also be sawed with the wafer, and its segments may be released from the resulting chips in the same manner as the first member.

It may also be expeditious to utilize the second member to hold together the sawed chips in their original relative orientations. This may be achieved by sawing through the first member and only partially sawing through the wafer or, in any event, not sawing through the second member. The integral second member maintains the chips together following the breaking apart of the partially saved wafer.

In its broad aspect, the present invention also contemplates apparatus for effecting the above-described sawing of wafers while protecting the active sites thereof. The apparatus includes the first tape-like member with the pattern of treatable-to-release adhesive thereon, and may also include the second tape-like member covered with a similar adhesive.

DETAILED DESCRIPTION

Figure 1A:
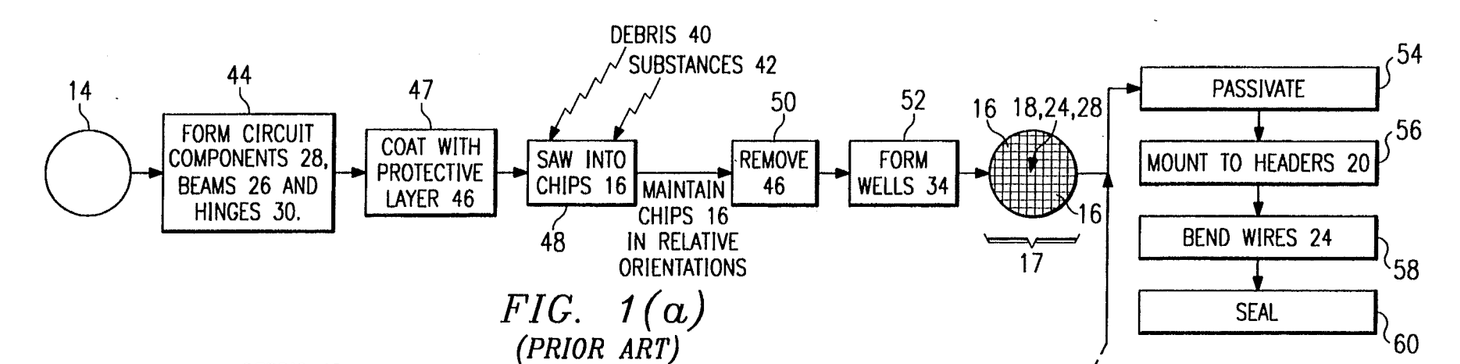
FIGS. 1(a) and 1(b) are respective schematic depictions of prior art methods for sawing semiconductor wafers to produce separate chips each having an active site thereon.
Figure 1B:
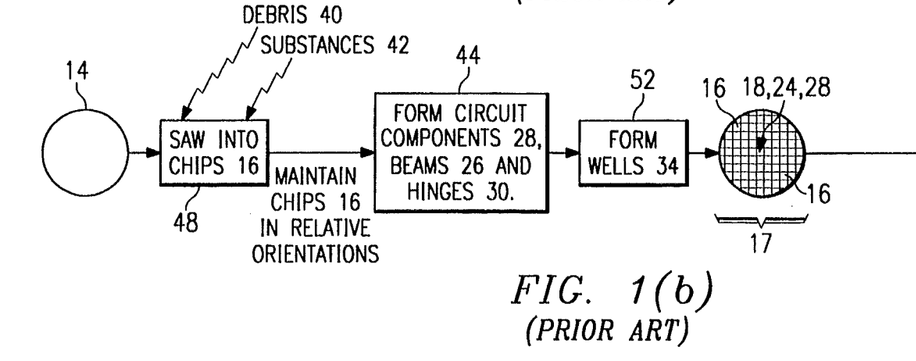
Figure 2:
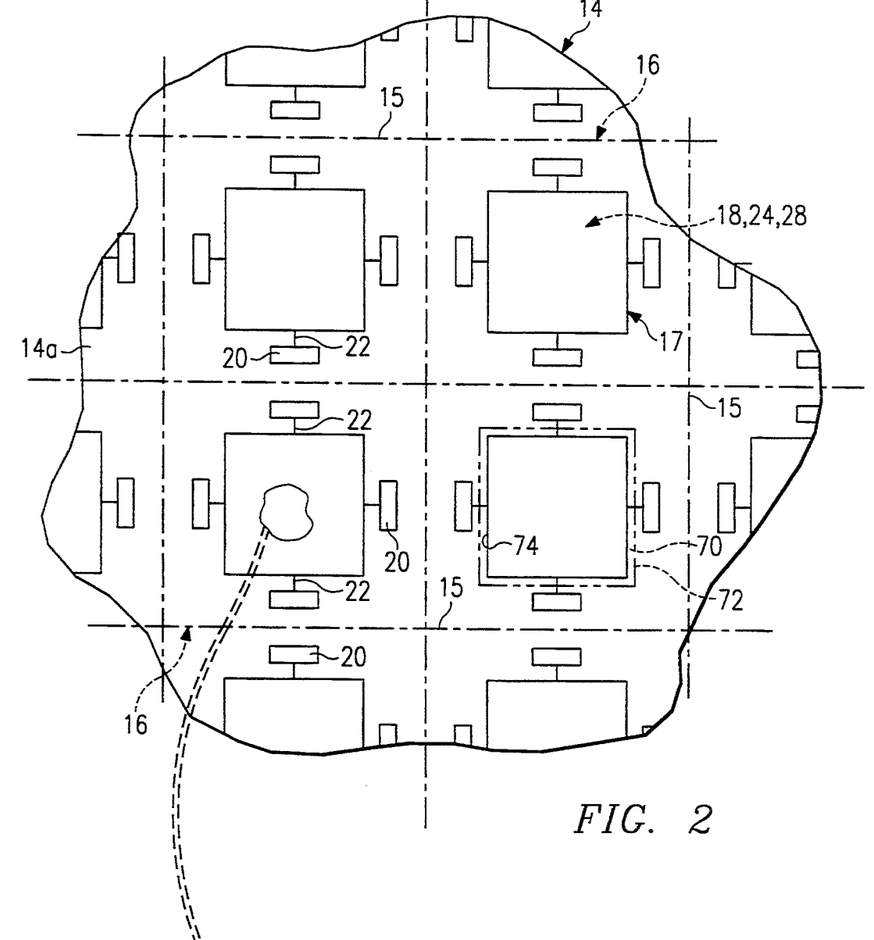
FIG. 2 is a magnified top schematic view of one of a portion of a wafer having respective arrays of active sites.
Figure 3:
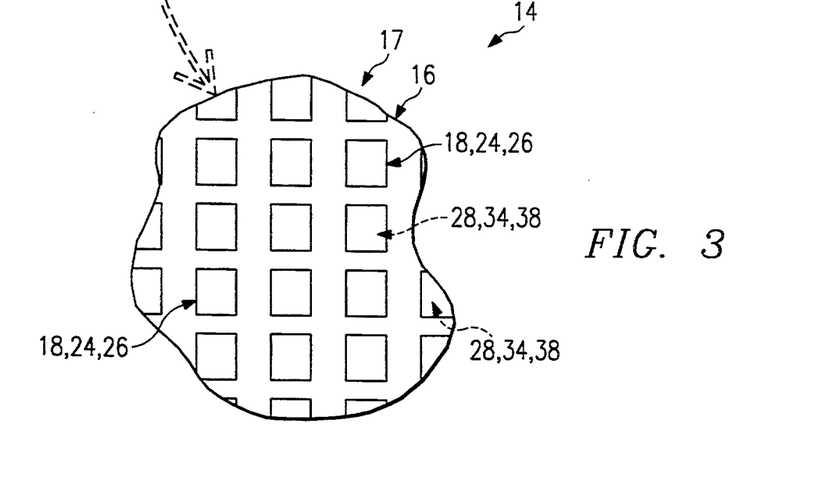
FIG. 3 is a magnified top schematic view of one of the arrays shown in FIG. 2.

Referring first to FIGS. 1(a) and 1(b), two prior art methods for sawing a semiconductor wafer 14 along saw paths or streets 15 into separate chips 16 are schematically depicted. As shown in FIG. 2, each chip 16 includes an array 17 of active sites, generally indicated at 18 in FIG. 3. Each chip 16 also includes associated bond pads 20. The bond pads 20 are electrically continuous with the active sites 18 via conductors 22 deposited on the wafer 14, on which conductors 22 the bond pads 20 are formed. The conductors 22 may be produced by some of the same procedures which produce the active sites 18 and are electrically continuous therewith. Ultimately each chip 16 is individually mounted to a header (not shown) and the bond pads 20 are rendered electrically continuous with conductive lands (not shown) on the header by bonding wires (not shown) to and between the pads 20 and the lands.

Each active site 18 may include a DMD or other SLM, generally denoted 24. A preferred DMD 24 is generally of the multi-layered type generally shown in FIGS. 5–7 and more specifically described in commonly assigned U.S. Pat. No. 5,066,049 to Hornbeck and U.S. Pat. No. 3,600,798 to Lee. Other types of DMD's 24, are shown in U.S. Pat. Nos. 4,306,784 to Cade, 4,229,786 to Hastein et al, 3,896,338 to Nathanson et al, and 3,886,270 to Guldberg et al. Any of the above types of DMD's may be used in the systems shown in commonly assigned U.S. Pat. Nos. 5,221,232 to Nelson et al, 5,079,544 to DeMond et al, U.S. Pat. No. 5,041,850 to Nelson, and 4,788,225 to Thomas.

Figure 5:
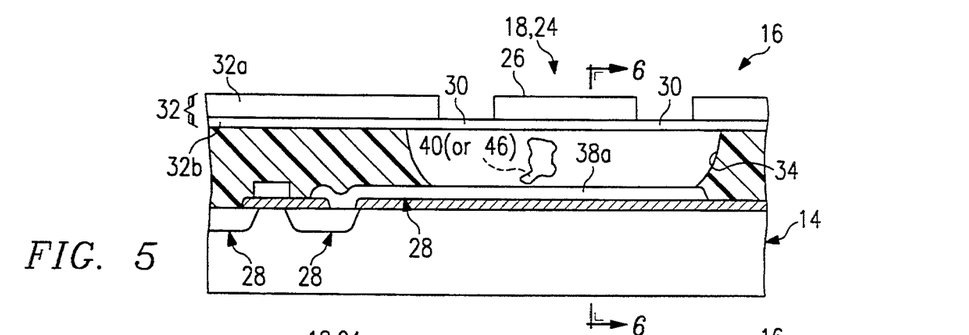
FIG. 5 is a sectioned side elevation of one active site of one of the arrays depicted in FIGS. 2–4.
Figure 6:
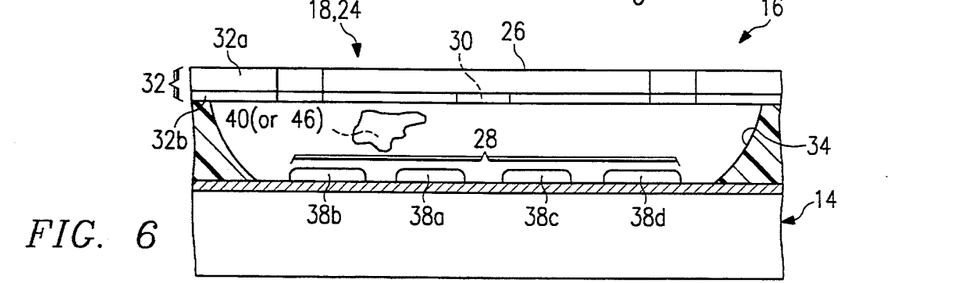
FIG. 6 is a sectioned side elevation of the active site shown in and taken along line 6—6 of FIG. 5.
Figure 7:
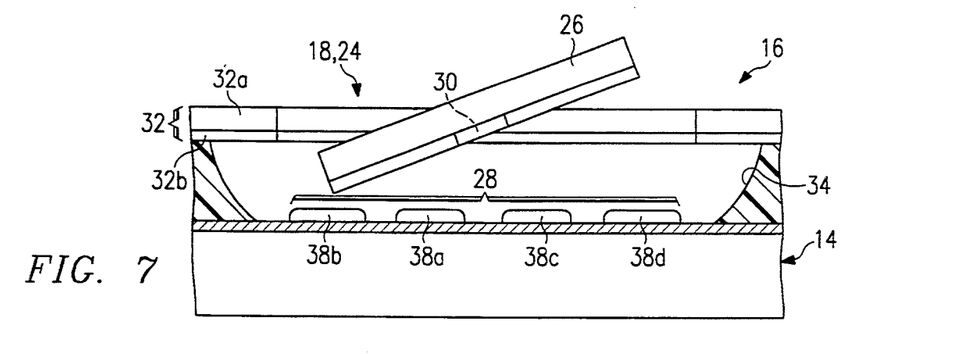
FIG. 7 is similar to FIG. 6 and depicts the deflection of a beam of a DMD included in the active site of FIGS. 5 and 6.

Referring to FIGS. 5–7, a preferred multi-layered DMD 24 includes a reflective, deflectable beam 26 and associated circuit components or addressing circuitry 28 for selectively deflecting the beam 26. Methods of monolithically forming the beams 26 and the circuit components 28 are set forth in the above-noted patents. Typically, the beam 26 deflects by moving or rotating from a normal position (FIG. 6) to another position (FIG. 7). Such rotation deforms one or more hinges 30 supporting the beam 26. The stored energy tends to return the beam 26 to the normal position of FIGS. 5 and 6. The hinge 30 and the beam 26 may both originate with a layer 32 having two strata 32a and 32b, a portion of the stratum 32b being removed from the stratum 32a to produce the hinge 30, as best seen in FIG. 5. An undercut well 34 is provided "beneath" each beam 26 to accommodate the deflection. The well 34 may be viewed as being "above" each beam 26 or "adjacent" each beam 26 depending on the orientation of FIGS. 6 and 7. Usually, deflection of the beam 26 is effected by the attractive force exerted thereon by an electric field resulting from a potential on one of the circuit components 28, such as an electrode 38a located in the well 34. The potential of the electrode 38a is produced by the circuit components 28. Other electrodes 38b–d may also reside in the well 34 for selectively affecting the position of the beam 26. The beam 26 modulates light incident thereon in only a selected one of its positions by reflecting the light onto a viewing surface.

The prior art method and apparatus schematically depicted in FIG. 1(a) are utilized when the circuit components 28 and the beam 26 of each DMD 24 in each array 17 of active sites 18 can be protected so as to not be adversely affected by debris 40 resulting from, and by fluids and other substances 42 used in, sawing the wafer 14 into the chips 16. The active sites 18 are produced on the top or first surface 14a of the wafer 14.

Figure 10:
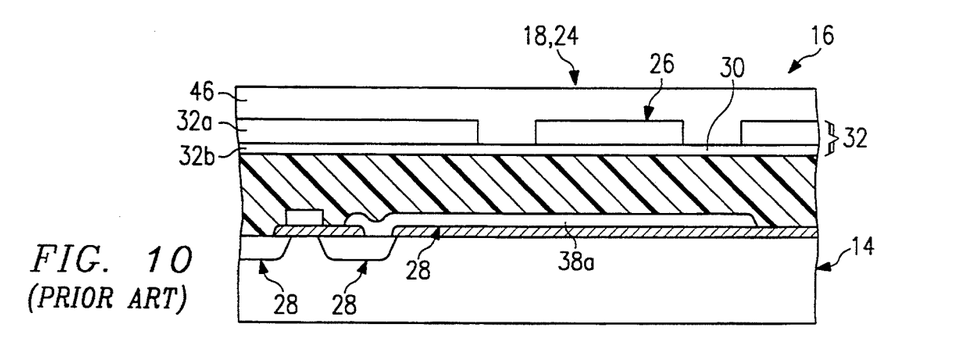
FIG. 10 shows an active side of a chip as protected by a prior art technique.

After the wafer 14 is partially processed, as generalized at 44, to form the circuit components 28 and to define the beams 26 and their hinges 30, but not the wells 34, the wafer 14 is covered with a protective layer 46, as generally depicted at 47 in FIG. 10(a). The wafer 14 is then sawed into the chips 16, as depicted at 48, the protective layer 46 preventing the debris 40 and the substances 42 used in sawing from adversely affecting the active sites 18 and the beams 26. Thereafter, the layer 46 is removed and the undercut wells 34 are formed as schematically indicated at 50 and 52, respectively.

The wells 34 are not formed prior to sawing for at least two reasons. First, if the wells 34 were present, the debris 40 or other substances 42 might enter the wells 32 when the protective layer 46 is removed. Unless such debris 40 or other substances 42 are completely removed, the ability of the beams 26 to deflect could be compromised. Second, if the wells 34 contain any of the material of the protective layer 46, such must be completely removed therefrom after sawing. The presence of this material (e.g. particles of the protective layer 46) can have the same deleterious effect on beam deflection as the debris 40 and the other substances 42.

Following sawing 48, the chips 16 are maintained in their original relative orientations and locations while the layer 46 is removed and the wells 34 are formed. Finally, the chips 16 are passivated, individually mounted to the headers, bonded by the wires to the lands, and sealed, all as respectively depicted at 54, 56, 58 and 60.

FIG. 1(b) depicts a method and apparatus similar to those shown in FIG. 1(a), except that it is assumed that the active sites 18 and the beams 26 cannot tolerate either the debris 40 and other substances 42 or the protective layer 46. In this event, the wafer 14 is sawed as at 48 prior to the formation of the active sites 18, the beams 26 and the wells 34 on the top surface 14a, these items being formed after sawing the wafer 14 into individual chips 16 while the chips 16 are held and maintained together in their original relative orientations and locations.

Accordingly, the present invention permits the DMD processing steps 44 and 52 to be carried out before sawing 48 is effected and without the need to hold the chips 16 together in their original relative orientations and locations.

Figure 4:
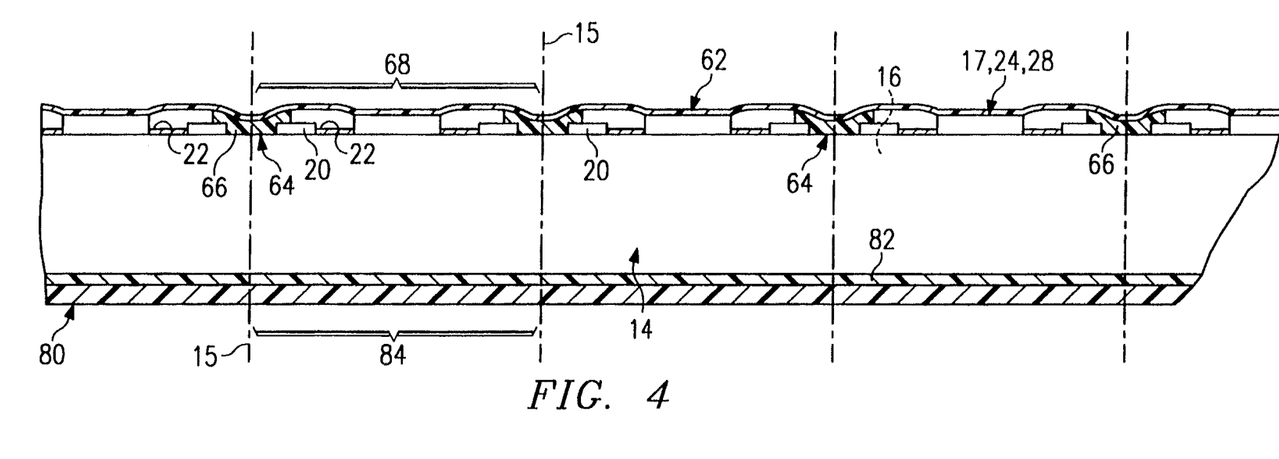
FIG. 4 is generalized side elevation of a chip sawed from a wafer, the active site array thereof being protected by one form of apparatus according to the present invention.
Figure 11:
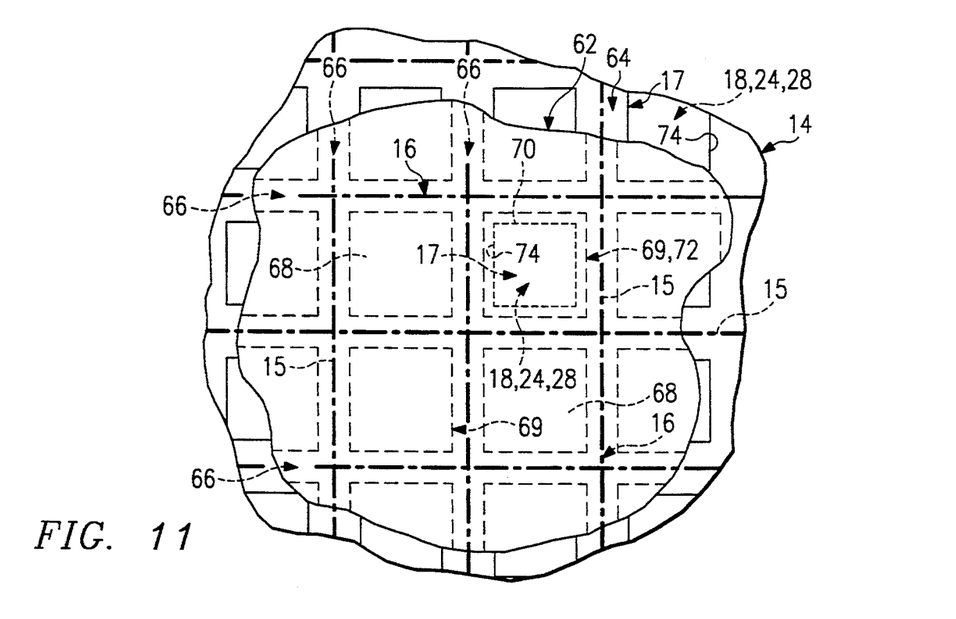
FIG. 11 is a magnified, partial top view of apparatus for effecting the present invention.
Figure 12:
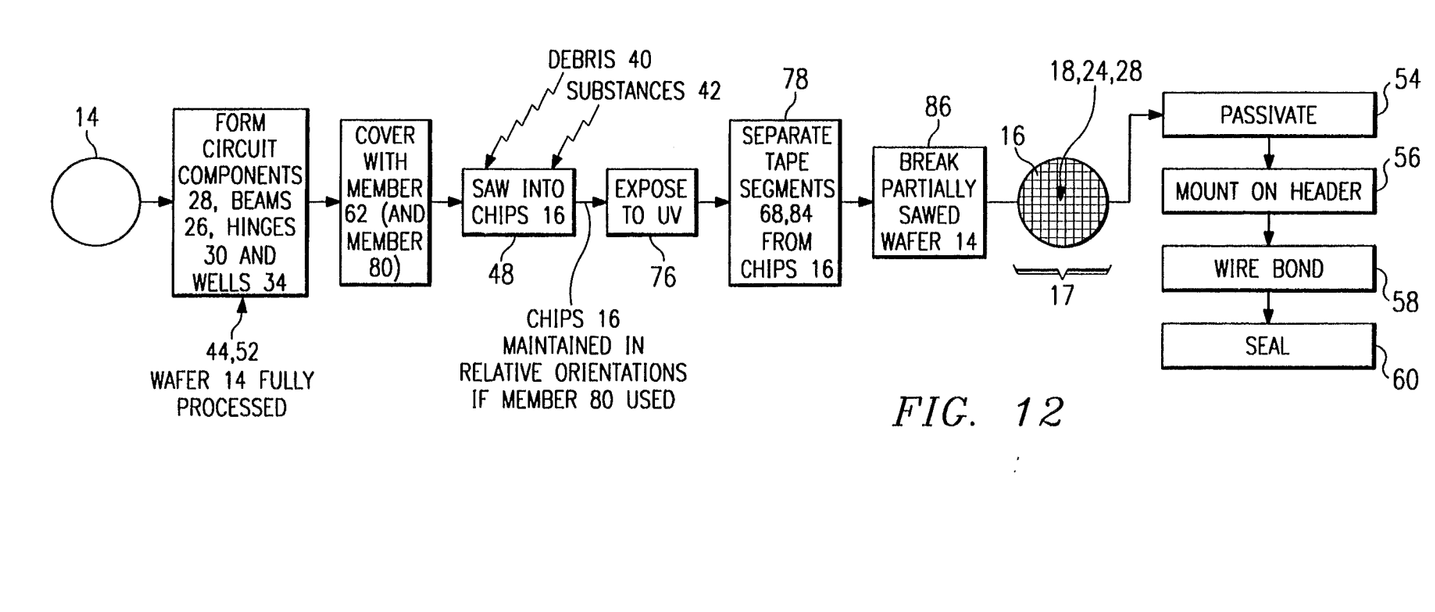
FIG. 12 is a schematic representation of the use of the apparatus of the present invention to practice the method thereof.

Referring to FIGS. 4, 11 and 12, after the processing steps 44 rand 52 are carried out to form the arrays 17 of active sites 18, including the beams 26, the hinges 30 and the wells 34 of the DMD's 24, the wafer 14 is overlain with a tape-like member 62. The member 62 may be of any suitable flexible material, which is preferably, for reasons set forth below, transparent to or transmissive of UV.

Pursuant to FIGS. 2, 4 and 11, the tape-like member 62 carries a pattern 64 of adhesive. The adhesive pattern 64 preferably comprises a rectangular grid of straight adhesive lines 66 which define non-adhesive-bearing segments 68 of the member 62 therebetween. For reasons set forth below, the adhesive 66 preferably reacts to UV by losing its adhesiveness.

The patterned adhesive 64 is registered with and centered over the saw paths 15 which may be virtual or may be previously formed scribing. Each box-like portion 69 of the pattern 64 surrounding an adhesive-free segment 68 is congruent with an area 70 bounded by a perimeter 72 surrounding its array 17. Each perimeter 72 resides between the periphery 74 of its array 17 and the associated bond pads 20. As seen in FIG. 12, the pattern 64 may be registered with the saw paths 15 in any convenient manner and by any convenient expedient, such as a standard alignment scope (not shown).

Acceptable materials for the member 62 are adhesive tapes 62, the adhesive 64,66 on which is selectively degradable or releasable, and, preferably, an adhesive tape 62 which is UV-transparent, the adhesive 64,66 of which is UV-degradable or -releasable.

The adhesive 64 mounts the member 62 and the segments 68 thereof to the wafer 14 and to the conductors 22 thereon to overlie and seal each array 17 against the entry thereinto of the debris 40 and the substances 42. Specifically, the box-like portions 69 of the patterned adhesive 64 and its adhesive lines 66 adhere to the wafer 14 so that the adhesive-free segments 68 overlie and encapsulate the active sites 18.

Figure 8:
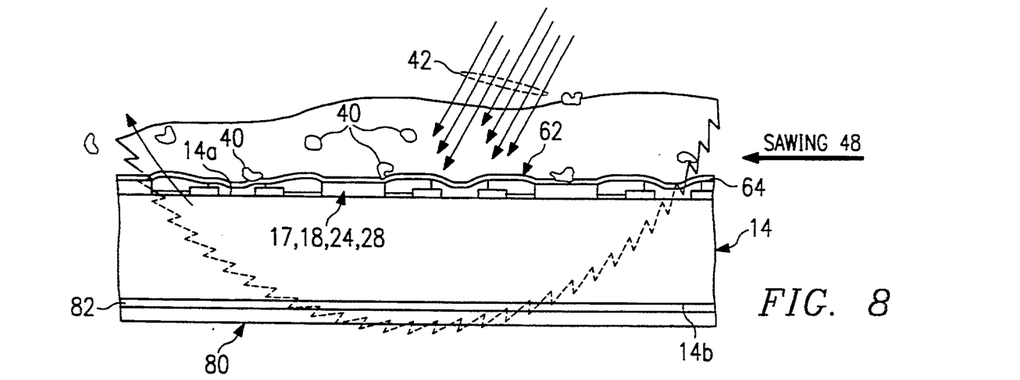
FIGS. 8 and 9 schematically illustrate the sawing of a wafer into chips, as generally depicted in FIG. 1, with active sites on each chip being protected by apparatus according to the present invention.

Following mounting of the member 62 to the wafer 14, the wafer 14 is sawed along the saw paths or streets 15 between the adjacent bond pads 20 of adjacent arrays 17, during which time the mounted member 62 prevents the debris and substances 40 and 42 from adversely affecting the active sites 18, as shown in FIG. 8. As depicted in FIG. 11, a grid of the saw paths or streets 15 may be defined prior to sawing by scribing the wafer 14, as is known.

The sawing separates the wafer 14 into the chips 16, while it separates the member 62 into its constituent adhesive-free segments 68. Preferably, the sawing operation separates the member 62 into the segments 68 by cutting the member 62 generally centrally along the lines 66 of the adhesive pattern 64 so that each segment 68 remains adhered to its chip 16 after sawing.

Sawing produces the chips 16, the active sites 18 of which are sealed by the segments 68 of the member 62 resulting from the sawing 48. The segments 68 are and continue to be, after sawing, adhered to the chips 16.

The member 62 and its segments 68 are intended to serve as temporary protective and prophylactic expedients during and immediately after sawing, which expedients remain in place until just prior to testing of the DMD's 24 on each chip 16. Therefore, prior to testing, the segments 68 are removed from their chips 16; after testing permanent protective facilities may then be utilized, if necessary.

Removal of the segments 68 is conveniently achieved according to the present invention by selecting an adhesive 64 which loses its adhesiveness when exposed to UV. To this end, the member 62 and its segments 68 are transparent to IV. After sawing 48, the chips 16 with the segments 68 adhered thereto by the portions 69 of the adhesive pattern 64 are exposed through the segments 68 to UV of appropriate wavelength and intensity. This exposure of the adhesive portions 69 to UV through the segments 68 causes the portions 69 to become non-adhesive. Preferably, when the adhesive 64 is a polymerizable material, the UV polymerizes it by hardening it until it loses its adhesiveness. This exposure step is illustrated in FIG. 12 by the reference numeral 76. After the segments 68 no longer adhere to the chips 16, the chips 16 and the segments 68 may be separated by the manipulation of appropriate tools or implements (not shown but indicated by the reference numeral 78 in FIG. 12) which may utilize negative pressure.

As shown in FIGS. 4, 8, 9 and 12, a second tape-like member 80 may also be utilized. Specifically, to facilitate handling of the wafer 14 and to mount the wafer 14 to a standard saw frame (not shown), a surface 14b of the wafer 14 opposite that 14a on which the active sites 18 are formed may be adhered to the member 80 by virtue of an area coating 82 of adhesive on the member 80. Except for the adhesive 82 not being patterned, the second member 80 and its adhesive 82 are the same as the member 62 and its adhesive 64. Accordingly, after sawing 48, during which both members 62 and 80 are sawed into constituent segments 68 and 84, exposure of the adhesives 64 and 82 removes the segments 68 and 84 from the chips 16 or facilitates separation of the chips 16 from the segments 68 and 84 by tools which may utilize negative pressure.

Figure 9:
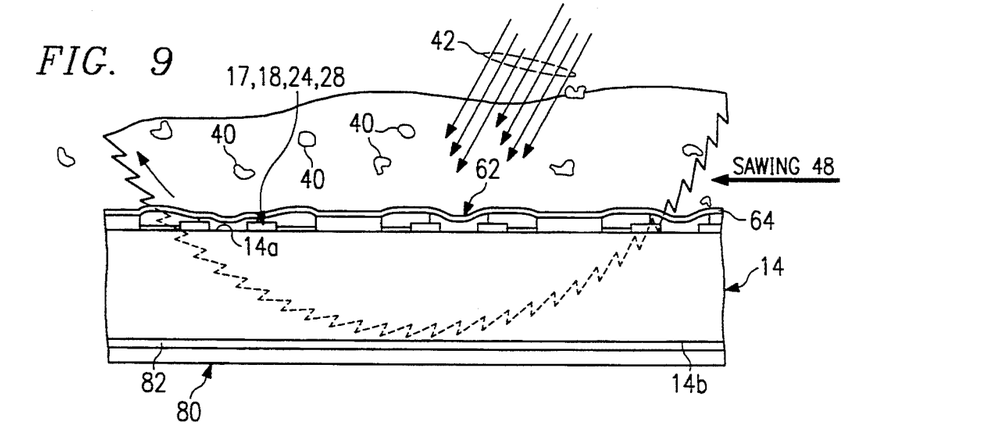

If desired, where the member 80 is used, the sawing may be carried out so that the wafer 14 is not completely sawed through as shown in FIG. 9. Separation of the wafer 14 into the chips 16 may be thereafter effected by passing the partially sawed wafer 14 over a curved surface or edge (not shown but indicated at 86 in FIG. 12) having an appropriate radius. Because the wafer 14 is initially not completely sawed through, the member 80 is also initially not separated into the segments 84. Accordingly, the individual chips 16 remain mounted on the integral member 80 for convenient handling after the partially sawed wafer 14 is broken apart to separate it into the chips 16.

While various preferred embodiments of the present invention have been described, those skilled in the art will appreciate that various changes of and additions to these embodiments may be made without departing from the present invention as covered by the following claims.

What is claimed is:

1. A method of protecting previously formed active sites on a first surface of a fully processed semiconductor wafer from particulate and fluid contaminants produced by and used in sawing the wafer along saw paths between the sites and into chips, each of which chips contain an active site, the method comprising:
    (a) contacting the first surface with a first tape-like member having one side thereof an adhesive pattern which is congruent and registered with the saw paths, the adhesive pattern bordering and defining non-adhesive-containing portions, the adhesive pattern adhering to the first surface along the saw paths so that the non-adhesive-containing portions overlie and encapsulate the active sites without adhesion thereto to seal the active sites against entry of the contaminants thereinto;
    (b) sawing the wafer along the paths through the first member to separate the wafer into chips and the first member into segments adhering to the chips; and
    (c) treating the adhesive to release the segments from the chips.

2. A method as in claim 1, wherein:
the adhesive is treated through the segments of the first member to release the segments from the chips.

3. A method as in claim 2, wherein:
the first member and its segments are UV-transmissive and the adhesive loses its adhesion when exposed to UV.

4. A method as in claim 3, which further comprises:
separating the chips from the segments of the first member after the adhesive has been exposed to UV.

5. A method as in claim 4, wherein:
separation of the chips from the segments is effected by applying negative pressure to either one or both thereof.

6. A method as in claim 4, wherein:
each site includes a deformable beam which may assume one position wherein it modulates incident light and other positions wherein it does not modulate incident light.

7. A method as in claim 1, which further comprises:
    (d) before step (a), adhering to a second surface of the wafer opposite the first surface a second tape-like member covered with an adhesive layer; and
    (e) after step (b), treating the adhesive on the second member to release the chips.

8. A method as in claim 7, wherein:
during step (b) the second member is sawed into segments.

9. A method as in claim 7, wherein:
step (b) is effected so that the wafer is not completely sawed through and the second member is not sawed into segments.

10. A method as in claim 9, wherein:
before steps (c) and (e), the partially sawed wafer is broken into chips by flexing it along the partially sawed-through saw paths, whereby the chips are retained in their original relative orientations by the second member.

11. A method as in claim 7, wherein: the adhesives are treated through the segments of the first and second members to release the segments from the chips.

12. A method as in claim 11, wherein:
the first and second members and their segments are UV-transmissive and the adhesives lose their adhesion when exposed to UV.

13. A method as in claim 12, which further comprises:

separating the chips from the segments of the first and second members after the adhesives have been exposed to UV.

14. A method as in claim 13, wherein:

separation of the chips from the segments is effected by applying negative pressure to either one or both thereof.

15. A method as in claim 13, wherein:

each site includes a deformable beam which may assume one position wherein it modulates incident light and other positions wherein it does not modulate incident light.

16. Apparatus for protecting previously formed active sites on a first surface of a fully processed semiconductor wafer from particulate and fluid contaminants produced by and used in sawing the wafer along saw paths between the sites and into chips, each of which chips contains one of the sites, the apparatus comprising:

a first tape-like member having on one side thereof an adhesive pattern which is congruent and registerable with the saw paths, the adhesive pattern bordering and defining non-adhesive containing portions, the adhesive pattern being adapted to adhere to the first surface along the saw paths so that the non-adhesive-containing portions overlie and encapsulate the active sites without adhesion thereto to seal the active sites against entry of the contaminants thereinto, the adhesive being subsequently treatable so as to lose its adhesion, whereby sawing the wafer along the paths through the first member adhered thereto separates the wafer into chips and the first member into segments.

17. Apparatus as in claim 16, wherein:

the adhesive and the member are such that the adhesive is treatable through the segments of the first member to release the segments from the chips.

18. Apparatus as in claim 17, wherein:

the first member and its segments are UV-transmissive and the adhesive loses its adhesion when exposed to UV.

19. Apparatus as in claim 16, which further comprises:

a second tape-like member covered with an adhesive layer, the layer being adapted to adhere to a second surface of the wafer opposite the first surface, the adhesive being treatable to lose its adhesion.

20. Apparatus as in claim 19, wherein:

the second member is adapted to be sawed into segments when the wafer is sawed.

21. Apparatus as in claim 19, wherein:

the second member is adapted to remain integral if the wafer is only partially sawed through.

22. Apparatus as in claim 21, wherein:

if the partially sawed wafer is broken into chips, the second member is adapted to retain the chips in their original relative orientations.

23. Apparatus as in claim 19, wherein:

the adhesives are treatable through the segments of the first and second members to release the segments from the chips.

24. Apparatus as in claim 23, wherein:

the first and second members and their segments are UV-transmissive and the adhesives lose their adhesion when exposed to UV.

25. Apparatus as in claim 24, wherein:

the chips and the segments of the first and second members are separable after the adhesives have been exposed to UV.

* * * * *